(12) United States Patent
Zhang et al.

(10) Patent No.: US 9,070,772 B2
(45) Date of Patent: Jun. 30, 2015

(54) ARRAY SUBSTRATE AND MANUFACTURING METHOD THEREOF (75) Inventors: Honglin Zhang, Beijing (CN); Dan Wang, Beijing (CN); Xibin Shao, Beijing (CN)

(73) Assignees: BOE TECHNOLOGY GROUP CO., LTD., Beijing (CN); BEIJING BOE DISPLAY TECHNOLOGY CO., LTD., Beijing (CN)

( * ) Notice: Subject to any disclaimer, the term of this patent is extended or adjusted under 35 U.S.C. 154(b) by 0 days.

(21) Appl. No.: 13/703,711

(22) PCT Filed: Aug. 22, 2012

(86) PCT No.: PCT/CN2012/080462
§ 371 (c)(1),
(2), (4) Date: Dec. 12, 2012

(87) PCT Pub. No.: WO2013/026395
PCT Pub. Date: Feb. 28, 2013

(65) Prior Publication Data
US 2013/0221357 A1 Aug. 29, 2013

(30) Foreign Application Priority Data
Aug. 23, 2011 (CN) .......................... 2011 1 0243246

(51) Int. Cl.
*H01L 33/00* (2010.01)
*H01L 29/786* (2006.01)
(Continued)

(52) U.S. Cl.
CPC ............ *H01L 29/786* (2013.01); *G02F 1/1368* (2013.01); *H01L 29/66477* (2013.01); *H01L 29/66765* (2013.01); *H01L 27/1288* (2013.01)

(58) Field of Classification Search
CPC . H01L 27/124; H01L 27/127; H01L 27/1214; H01L 27/1259; H01L 27/1288; H01L 29/786; H01L 29/66477; H01L 33/36; H01L 33/44
USPC .......................... 438/148–151; 257/E21.414
See application file for complete search history.

(56) References Cited

U.S. PATENT DOCUMENTS 6,160,270 A * 12/2000 Holmberg et al. ............... 257/59
7,157,735 B2 * 1/2007 Fujikawa et al. ................ 257/59
(Continued)

FOREIGN PATENT DOCUMENTS

| CN | 1992236 A | 7/2007 |
|---|---|---|
| CN | 101359634 A | 2/2009 |

(Continued)

OTHER PUBLICATIONS
CN-101452163 (A) English Translation (2009).*
(Continued)

*Primary Examiner* — Matthew W Such
*Assistant Examiner* — Stephen C Smith
(74) *Attorney, Agent, or Firm* — Ladas & Parry LLP (57) ABSTRACT

Embodiments of the present invention disclose an array substrate and a manufacturing method thereof. The method comprises forming a patterned active layer on a gate insulating layer, the active layer covering a part of the gate insulating layer; forming a source/drain electrode material layer on the active layer and the gate insulating layer; forming a patterned insulating layer on the source/drain electrode material layer; conducting an etching process by using the insulating layer as a mask, so as to etch the source/drain electrode material layer to form a source electrode and a drain electrode, etch a part of the insulating layer to form a via hole in the insulating layer over the drain electrode, and etch a part of the active layer between the source electrode and the drain electrode to form a channel.

11 Claims, 5 Drawing Sheets cutting line AA'

A - - - - - - - - - - - - A'

(51) Int. Cl.
*G02F 1/1368* (2006.01)
*H01L 29/66* (2006.01)
*H01L 27/12* (2006.01)

(56) References Cited

U.S. PATENT DOCUMENTS

| | | | |
|---|---|---|---|
| 8,183,070 B2* | 5/2012 | Kim et al. | 438/30 |
| 8,431,452 B2* | 4/2013 | Hou et al. | 438/164 |
| 2005/0112790 A1 | 5/2005 | Lan et al. | |
| 2007/0166894 A1 | 7/2007 | Lim | |
| 2009/0225249 A1* | 9/2009 | Wang et al. | 349/43 |
| 2010/0289977 A1 | 11/2010 | Liu | |
| 2011/0212581 A1* | 9/2011 | Jung et al. | 438/160 |
| 2012/0070946 A1* | 3/2012 | Hsieh | 438/158 |

FOREIGN PATENT DOCUMENTS

| | | | |
|---|---|---|---|
| CN | 101373301 A | | 2/2009 |
| CN | 101452163 A | * | 6/2009 ............ G02F 1/1362 |
| CN | 101494201 A | | 7/2009 |
| CN | 101726945 A | | 6/2010 |
| CN | 101740604 A | | 6/2010 |
| CN | 101825815 A | | 9/2010 |
| CN | 101887897 A | | 11/2010 |
| CN | 102629575 A | | 8/2012 |

OTHER PUBLICATIONS

First Chinese Office Action dated Jul. 29, 2013; Appln. No. 201110243246.8.
International Search Report dated Dec. 13, 2012; PCT/CN2012/080462.
Second Chinese Office Action dated Jan. 6, 2014; Appln. No. 201110243246.8.
International Preliminary Report on Patentability dated Feb. 25, 2014; PCT/CN2012/080462.
Third Chinese Office Action dated May 29, 2014; Appln. No. 201110243246.8.

* cited by examiner

ARRAY SUBSTRATE AND MANUFACTURING METHOD THEREOF

TECHNICAL FIELD

Embodiments of the present invention relate to an array substrate and a manufacturing method thereof.

BACKGROUND

A thin film transistor liquid crystal display (TFT-LCD) is an active matrix type liquid crystal display, which has features such as high contrast, rich colors and high refresh rate.

A display screen is composed of a great amount of pixels that emit light with particular colors, and the colors displayed by each of the pixels can be controlled individually so as to display a picture. Typically, the TFT-LCD has a back light unit. In order to control the color and contrast of each pixel precisely, a thin film field effect transistor with a switch function is required to be disposed at the position of each pixel.

The pixels may have three primary colors, i.e. red (R), green (G) and blue (B), accordingly, red, green and blue filters are disposed corresponding to the position of each pixel. Each of the filters corresponds to one thin film field effect transistor. When the thin film filed effect transistor is turned on, by controlling the on-current magnitude and using the optical activity of liquid crystal molecular filled in each pixel, the optical rotation extent of the liquid crystal molecular is changed, so that the light passing through the filters can be changed and the respective pixels can display distinctive colors.

Figure 11:
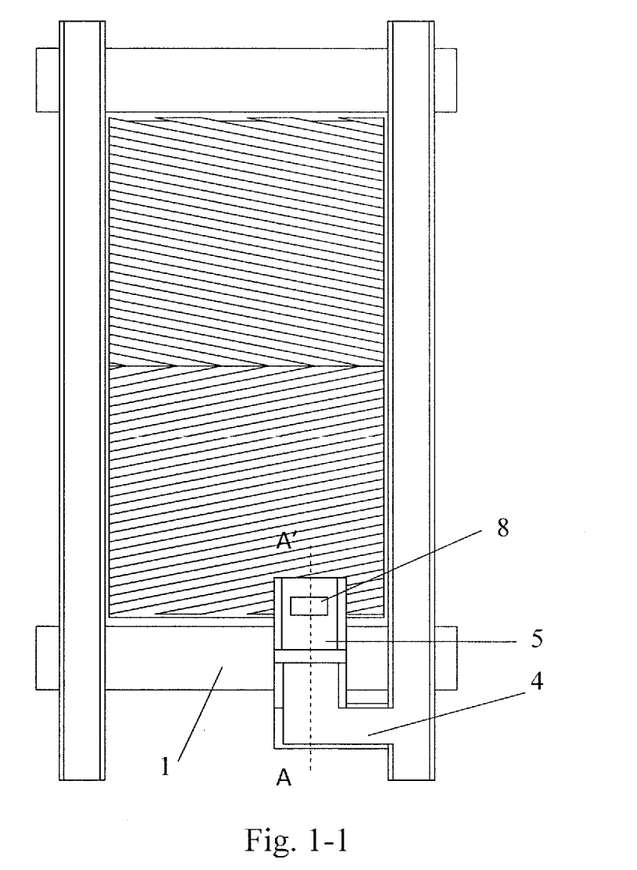
Figure 12:
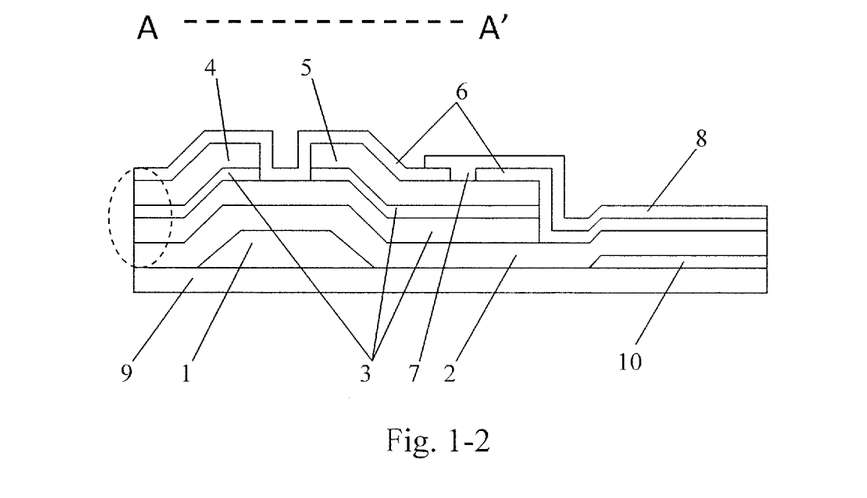

FIG. 1-2 is a cross-sectional view taken along a cutting line A-A' in FIG. 1-1. As shown in FIG. 1-2, a thin film filed effect transistor comprises a gate electrode 1, a gate insulating layer 2, an active layer 3, and a source/drain electrode (S/D) layer. The S/D layer comprises a source electrode 4 and a drain electrode 5, and a channel is formed between the source electrode 4 and the drain electrode 5. When a voltage is applied on the gate electrode 1, the source electrode 4 and the drain electrode 5 are communicated through the active layer 3. The active layer 3 comprises a layer of doped amorphous silicon ($N^+$ a-Si) and a layer of amorphous silicon (a-Si). An insulating layer 6 is arranged on the S/D layer. The drain electrode 5 is connected to a pixel electrode 8 through a via hole 7 in the insulating layer 6. The pixel electrode 8 is distributed for each of the pixels in the display region on a glass substrate 9. A common electrode 10 is formed on the glass substrate 9 and under the pixel electrode 8. The common electrode 10 and the pixel electrode 8 constitute an energy storage capacitor.

A method for manufacturing a liquid crystal panel in an existing technology, mainly comprises:

Step S201, forming a first transparent electrode, i.e. a common electrode, on a glass substrate by a mask process.

Since the common electrode on the glass substrate has a certain pattern, the common electrode is shaped by the mask process. The mask process mainly comprises steps of: lamination (application of photoresist), i.e. attaching a layer of photoresist onto the glass substrate; exposure, irradiating or not irradiating the pattern region for the common electrode depending on the property of the photoresist; development, removing the photoresist in the irradiated or un-irradiated region after the exposure so as to form a photoresist pattern; etching, performing an etch process by using the photoresist pattern as a mask, so as to obtain the common electrode pattern.

Step S202, forming a gate electrode on the glass substrate by a mask process.

Similarly, as the gate electrode also has a certain pattern, it needs the mask process to fabricate the gate electrode with the certain pattern.

Step S203, fabricating an S/D layer and an active layer by using a half-tone mask.

A gate insulating layer needs to be formed on the gate electrode before the S/D layer and the active layer are fabricated, in order to protect the gate electrode and make it insulated from the active layer.

The half-tone mask process has the following property: the etching thicknesses in different regions are different during the etching. The un-etched S/D layer and active layer are applied onto the gate insulating layer simultaneously, and the S/D layer and a channel between the source electrode and the drain electrode are formed in one mask process.

Step S204, forming an insulating layer on the S/D layer and forming a via hole in the insulating layer by a mask process.

Step S205, forming a second transparent electrode (pixel electrode) on the insulating layer, and the pixel electrode is connected with the drain electrode through the via hole.

Figure 13:
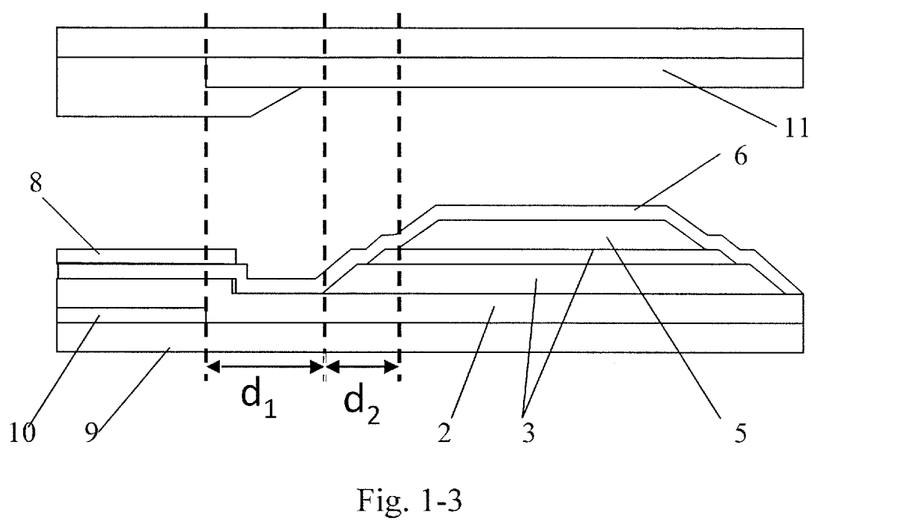

During the aforementioned process of manufacturing liquid crystal panel, since a half-tone mask is employed for the S/D layer and the active layer, etching on the S/D layer and etching on the active layer can be conducted in one mask step. It is desired that an edge of the active layer is aligned with an edge of the S/D layer, as in the form indicated by a dotted line in FIG. 1-2. However, as shown in FIG. 1-3, since the etching methods and the etching rates are different for the S/D metal layer and the active layer, the edge of the active layer is not aligned with the edge of the S/D layer but has a distance of d2 therebetween, and thus the active layer is exposed to the external. In order to avoid the influence of the coupling storage capacitor at the edge of the electrode, a distance d1+d2 and a width of a black matrix (BM) 11 are required to be increased. In such a case, not only the pixel electrical property is influenced, but also the design on the black matrix 11 will be adversely influenced, thereby reducing the aperture ratio.

SUMMARY

An embodiment of the present invention provides a method for manufacturing an array substrate, comprising: forming a patterned active layer on a gate insulating layer, the active layer covering a part of the gate insulating layer; forming a source/drain electrode material layer on the active layer and the gate insulating layer; forming a patterned insulating layer on the source/drain electrode material layer; conducting an etching process by using the insulating layer as a mask, so as to etch the source/drain electrode material layer to form a source electrode and a drain electrode, etch a part of the insulating layer to form a via hole in the insulating layer over the drain electrode, and etch a part of the active layer between the source electrode and the drain electrode to form a channel.

Another embodiment of the present invention provides an array substrate, comprising: a substrate; a gate electrode and a common electrode disposed on the substrate; a gate insulating layer covering the gate electrode and the common electrode; an active layer disposed on the gate insulating layer and over the gate electrode; a source electrode and a drain electrode disposed on the active layer, the source electrode and the drain electrode being separated from each other so as to form a channel in the active layer between the source electrode and the drain electrode, the channel being disposed over the gate electrode; an insulating layer disposed over the source electrode and the drain electrode, the insulating layer having a via hole over the drain electrode; and a pixel electrode connected with the drain electrode through the via hole, wherein an edge of the active layer is at the inner side of an edge of the source electrode and the drain electrode.

BRIEF DESCRIPTION OF THE DRAWINGS

In order to clearly illustrate the technical solution of the embodiments of the invention, the drawings of the embodiments will be briefly described in the following; it is obvious that the described drawings are only related to some embodiments of the invention and thus are not limitative of the invention.

FIGS. 1-1, 1-2, and 1-3 schematically illustrate structures of an array substrate in prior art; and FIGS. 2-1 to 2-7 schematically illustrate a method for manufacturing an array substrate in accordance with an embodiment of the present invention.

DETAILED DESCRIPTION

In order to make objects, technical details and advantages of the embodiments of the invention apparent, the technical solutions of the embodiment will be described in a clearly and fully understandable way in connection with the drawings related to the embodiments of the invention. It is obvious that the described embodiments are just a part but not all of the embodiments of the invention. Based on the described embodiments herein, those skilled in the art can obtain other embodiment(s), without any inventive work, which should be within the scope of the invention.

In terms of the adverse effects on both electrical property of the pixels and the design of the black matrix during the source/drain electrodes and the active layer are patterned by a half-tone mask process in prior art, embodiments of the present invention provide a novel method for manufacturing an array substrate suitable for a liquid crystal panel. The array substrate and the manufacturing method thereof in accordance with the embodiments of present invention are capable of effectively eliminating the aforementioned deficiencies existing in prior art, and increasing the aperture ratio.

An embodiment of the present invention provides a method for manufacturing an array substrate, comprising: forming a patterned active layer on a gate insulating layer, the active layer covering a part of the gate insulating layer; forming a source/drain electrode material layer on the active layer and the gate insulating layer; forming a patterned insulating layer on the source/drain electrode material layer; conducting an etching process by using the insulating layer as a mask, so as to etch the source/drain electrode material layer to form a source electrode and a drain electrode, etch a part of the insulating layer to form a via hole in the insulating layer over the drain electrode, and etch a part of the active layer between the source electrode and the drain electrode to form a channel.

In a conventional manufacturing process, the active layer is not patterned after the gate insulating layer is formed. Instead, a source/drain electrode material layer is deposited onto the active material layer, and then the active layer along with the source/drain electrode material layer are patterned together in one mask process by a half-tone mask technology. In such a case, the whole of the active layer under the source/drain electrodes remains. However, only a part of the active layer of the thin film field effect transistor (e.g., the part at the channel) merely plays a role in a part of the thin film transistor (e.g., in channel) is contributing, so the active layer that lies in other positions is redundant. This redundant part of active layer may probably lead to an adverse impact on both electrical property of pixels and the design of black matrixes, moreover, it also has a great influence on a coupling capacitance (i.e. the capacitance formed by a common electrode and a pixel electrode), which influences the design of the black matrix and decreases the aperture ratio. In embodiments of the present invention, etching and shaping (i.e. patterning) the active layer and forming the source/drain electrode layer are separately conducted, so that the active layer is formed at a position for communicating the source electrode and the drain electrode so as to play its role in the thin film field effect transistor, and no active layer exists in other places, which effectively overcomes the aforementioned deficiencies.

During the patterning of a S/D layer, the patterned insulating layer lying on the S/D layer is used as a mask for etching the S/D layer, thus, unlike the prior art (e.g., FIG. 1-2) in which the insulating layer covers the whole region, the region covered by the insulating layer is identical to that by the S/D layer in the embodiment of the invention. In embodiments of the present invention, the S/D layer and a via hole in the insulating layer are formed in one mask process, thus the shortages of the existing technology are eliminated and no new manufacturing step is introduced.

Preferably, the step of forming the patterned S/D layer and the insulating layer on the S/D layer with the via hole therein, comprises:

Appling a source/drain electrode material layer and a layer of insulating material in this order;

Patterning the layer of insulating material by a half-tone mask process, so that the layer of insulating material which corresponds to the position of a channel is removed, thereby exposing the source/drain electrode material layer, and a portion of the layer of insulating material corresponding to a position of the via hole is partly removed, thereby forming a recess in the layer of insulating material. That is to say, the etching thicknesses in different portions of the insulating layer are not identical during the etching process; the portion of the insulating layer corresponding to the channel position is removed completely, so as to expose the source/drain electrode material layer, while the portion of the insulating layer corresponding to the via hole position is removed partly in the thickness direction, so as to form the recess. The regions covered by the insulating layer after being patterned are the regions for manufacturing the source/drain electrodes.

For instance, the half-tone mask can be a grey-tone mask or a double-tone mask. After the photoresist is exposed by the half-tone mask, a completely exposed region, a partly exposed region and an unexposed region are formed. Then, the exposed photoresist is developed, and depending on the photoresist types, a completely etched region, a partly etched region and an unetched region corresponding to the aforementioned regions are generated. The completely etched region corresponds to a region which is beyond the source/drain electrodes, and comprises the region to form the channel; the partly etched region corresponds to the region to from the via hole; and the unetched region corresponds to the region to form the source/drain electrodes. Next, the layer of insulating material is etched by using the pattern of the photoresist as a mask, so that the insulating material layer in an region which is beyond the region to form the source/drain electrodes (including the area to form the channel) is removed; the pattern of the photoresist is ashed, so that the photoresist in the partly etched region is removed and the photoresist in the completely etched region is thinned; the layer of insulating material is etched with the pattern of the photoresist subjected to ashing, so that the portion of the insulating layer corresponding to the via hole position is removed, so as to form the recess in the insulating layer, simultaneously, the remaining portion of the insulating layer in the region which is beyond the source/drain electrodes (including the region for forming the channel) is also remove, so as to expose the active layer of the channel region; at a result, the patterned insulating layer is formed. The steps for forming the patterned insulating layer described herein can be merely considered as an example of the present invention, and it is not intended to limit the steps for forming the patterned insulating layer in accordance with the invention to the above specific steps.

By using the insulating layer as a mask for etching the S/D layer, the S/D layer is patterned and the channel between the source electrode and the drain electrode is formed, namely, lamination and exposure are not necessary. As the source/drain electrode material layer corresponding to the channel position is exposed, the insulating layer can be used as a mask of the S/D layer to pattern the S/D layer. Herein, the S/D layer is patterned by etching its portion which is not covered by the insulating layer, and this portion comprises the portion of the S/D layer located at the channel position.

The insulating layer is etched, and the via hole is formed at the recess of the insulating layer.

Preferably, the insulating layer and the source/drain electrode material layer are etched by different etching methods. The insulating layer is etched by a dry-etch method, such that the etching thereof will not affect the S/D layer. The source/drain electrode material layer (typically. metal) is etched by a wet-etch method. Similarly, the etching of the source/drain material layer will not affect the insulating layer. Thus, the via hole is formed in the insulating layer after the etching on the source/drain electrode material layer has been finished.

In terms of the active layer, the active layer in embodiment of the present invention comprises a layer of doped amorphous silicon ($N^+$ a-Si) and a layer of amorphous silicon (a-Si), the $N^+$ a-Si layer is arranged on the a-Si layer. Preferably, the $N^+$ a-Si layer at the channel position is not etched during formation of the patterned active layer. In a preferred embodiment of the present invention, in the meantime of etching the insulating layer to form the via hole, the $N^+$ a-Si layer exposed at the channel position is also etched, so as to expose the a-Si layer at the channel position, thereby finishing the formation of the active layer.

Preferably, the aforementioned patterned active layer is arranged on the gate insulating layer and over the gate electrode, where the active layer plays a role of communicating the source electrode and the drain electrode. As the shaping of the active layer is achieved in an individual etching step, the deficiency of exposing the active layer outwardly resulted from formation of the S/D layer by the half-tone mask technology is overcome.

The active layer has certain requirements on the pattern, so the formation thereof needs to use a mask process. In this embodiment, the step of forming the active layer on the gate insulating layer comprises: applying a layer of material for forming the active layer onto the gate insulating layer; and forming the patterned active layer by lamination, exposure, development and etching on the active layer. The specific processes for the lamination, exposure, development and etching can employ any suitable existing processes, and it will not be described in detail herein.

Before formation of the active layer, the method according to the embodiment of the present invention further comprises: forming a common electrode and a gate electrode on the substrate; and forming the gate insulating layer on the common electrode and the gate electrode to cover the common electrode and the gate electrode. The common electrode, the gate electrode and the gate insulating layer can be fabricated by any suitable existing manufacturing process, which is not particularly limited. Since the common electrode and the gate electrode have certain requirements on the pattern, it is preferred in the embodiment that the common electrode, the gate electrode and the gate insulating layer are formed in this order, which specifically comprises: forming the common electrode on the substrate by a mask process; forming the gate electrode on the substrate by a mask process; and forming the gate insulating layer which covers the common electrode and the gate electrode.

In a preferred embodiment of the present invention, after the formation of the insulating layer is finished, the method further comprises: forming a pixel electrode after forming the via hole, the pixel electrode being connected with the drain electrode through the via hole. In this embodiment, the step of forming the pixel electrode may comprise: forming the pixel electrode by a mask process, wherein the pixel electrode is formed to be connected with the drain electrode through the via hole.

In order to protect the channel, after forming the pixel electrode, the method of the embodiment further comprises: forming an insulating protection layer by a mask process, so as to cover both the channel and a part of the insulating layer at both sides of the channel.

Figure 21:
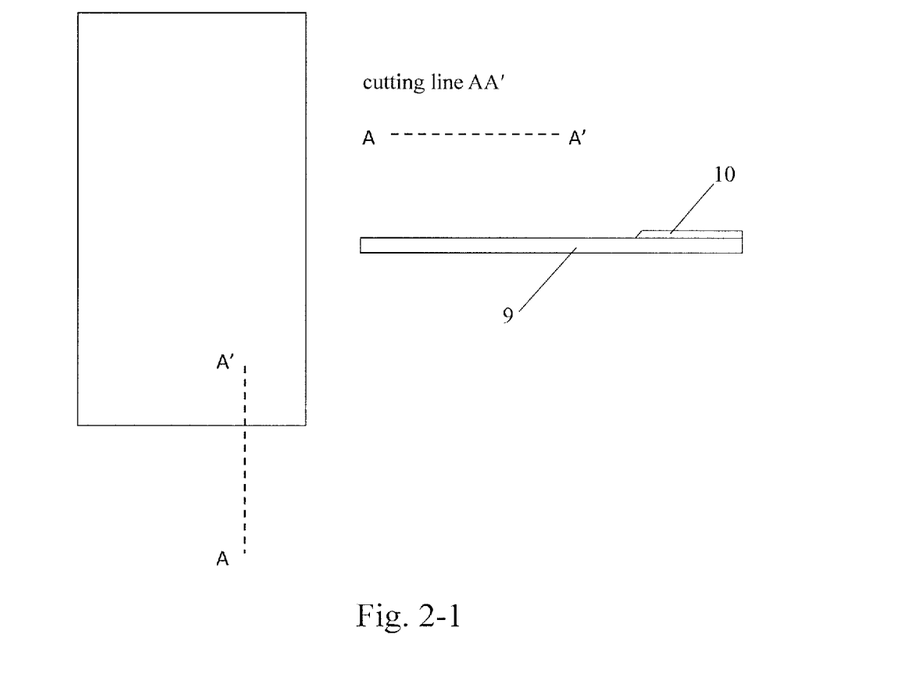

The method for manufacturing the array substrate according to the present invention comprise the following steps in details:

Step S301, forming a first transparent electrode (common electrode) 10 on a substrate 9 (e.g. a glass substrate) by a mask process, as shown in FIG. 2-1.

Figure 22:
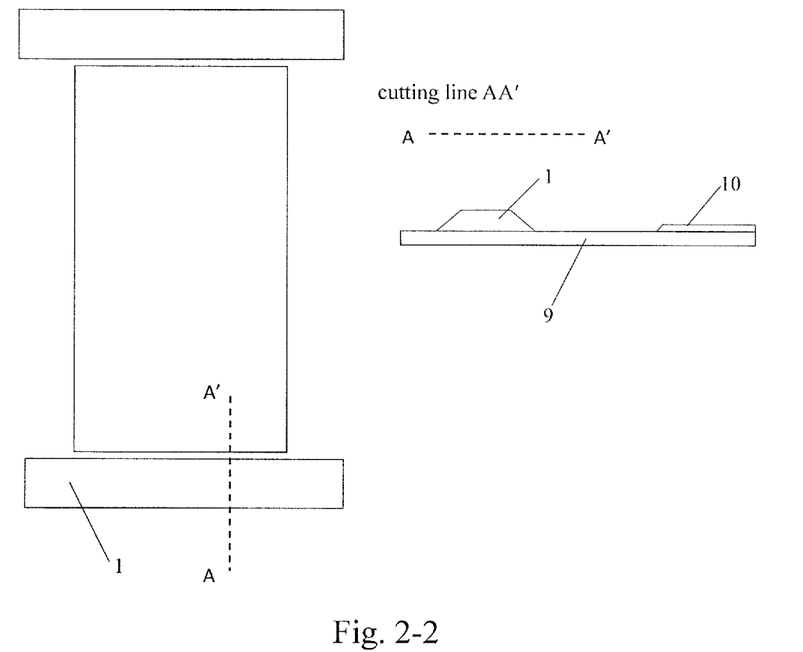

Step S302, forming a gate electrode 1 on the substrate 9 by a mask process, as shown in FIG. 2-2.

For instance, the gate electrode 1 is made of a metal.

Figure 23:
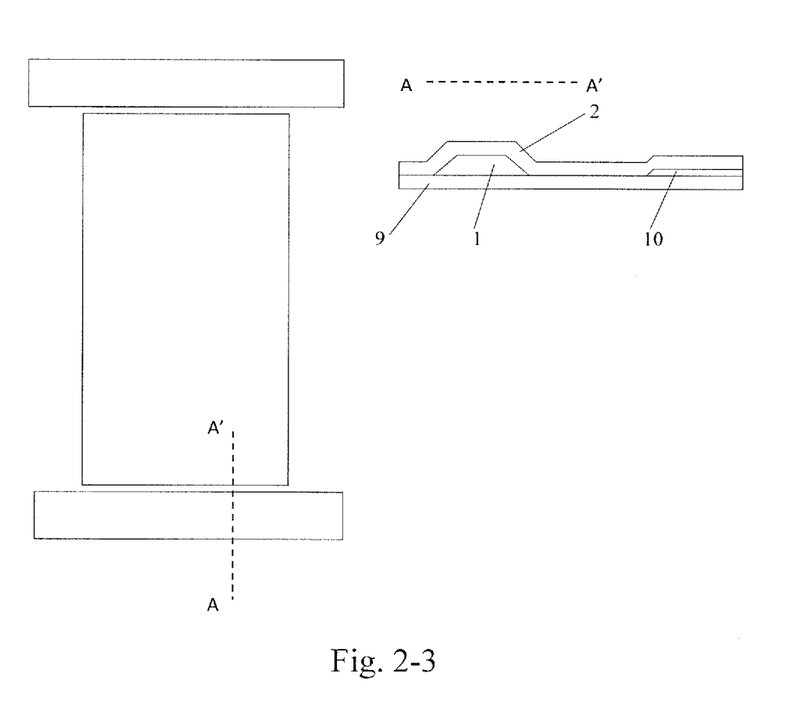

Step S303, forming a gate insulating layer 2 covering the gate electrode 1 and the common electrode 10.

As shown in FIG. 2-3, the gate insulating layer 2 can cover the gate electrode 1, the common electrode 10, and the portion between the gate electrode 1 and the common electrode 10.

Figure 24:
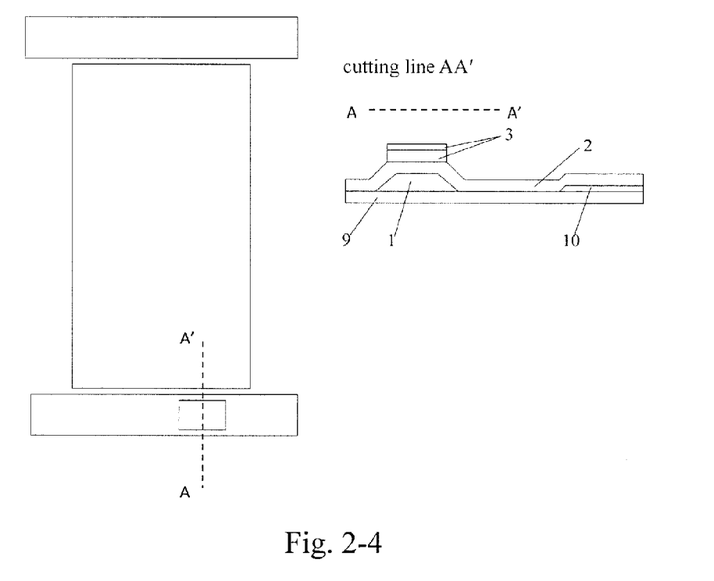

Step S304, forming a patterned active layer 3 on the gate insulating layer 2 by a mask process;

The mask process specifically comprises: applying a layer of material for forming the active layer onto the gate insulating layer; and forming the patterned active layer by lamination, exposure, development and etching on the active layer.

As shown in FIG. 2-4, the patterned active layer 3 is arranged on the gate insulating layer 2 opposing to the top of the gate electrode 1 (i.e. over the gate electrode 1).

The active layer 2 may comprise a layer of doped amorphous silicon ($N^+$ a-Si) and a layer of amorphous silicon (a-Si), wherein the $N^+$ a-Si layer at the portion for forming the channel is not etched. The doped amorphous silicon layer is over the amorphous silicon layer.

This step differs from the conventional manufacturing process. In the conventional manufacturing process, the active layer is not patterned after the gate insulating layer is formed, and a source/drain electrode material layer is deposited onto the active material layer successively, and then the active layer along with the S/D layer are patterned together in one mask process by a half-tone mask technology. However, only a part of the active layer of the thin film field effect transistor (e.g., the part at the channel) plays a role in a part of the thin film transistor (e.g., in channel) is contributing, so the active layer at other positions is redundant. This redundant part of active layer may probably lead to an adverse impact on both electrical property of pixels and the design of black matrixes, moreover, it also has a great influence on a coupling capacitance (i.e. the capacitance formed by a common electrode and a pixel electrode), which influences the design of the black matrix and decreases the aperture ratio. In embodiments of the present invention, etching and shaping (i.e. patterning) the active layer and forming the source/drain electrode layer are separately conducted, so that the active layer is formed at a position for communicating the source electrode and the drain electrode so as to play its role in the thin film field effect transistor, and no active layer exists in other places, which effectively overcomes the aforementioned deficiencies.

Step S305, forming a source/drain electrode material layer on the active layer and the gate insulating layer, forming a patterned insulating layer on the source/drain electrode material layer, and conducting an etching process by using the insulating layer as a mask, so that patterned source/drain electrodes and a via hole in the insulating layer are obtained. The specific process of patterning the insulating layer may refer to the aforementioned steps, and it will not be repeated herein.

Figure 25:
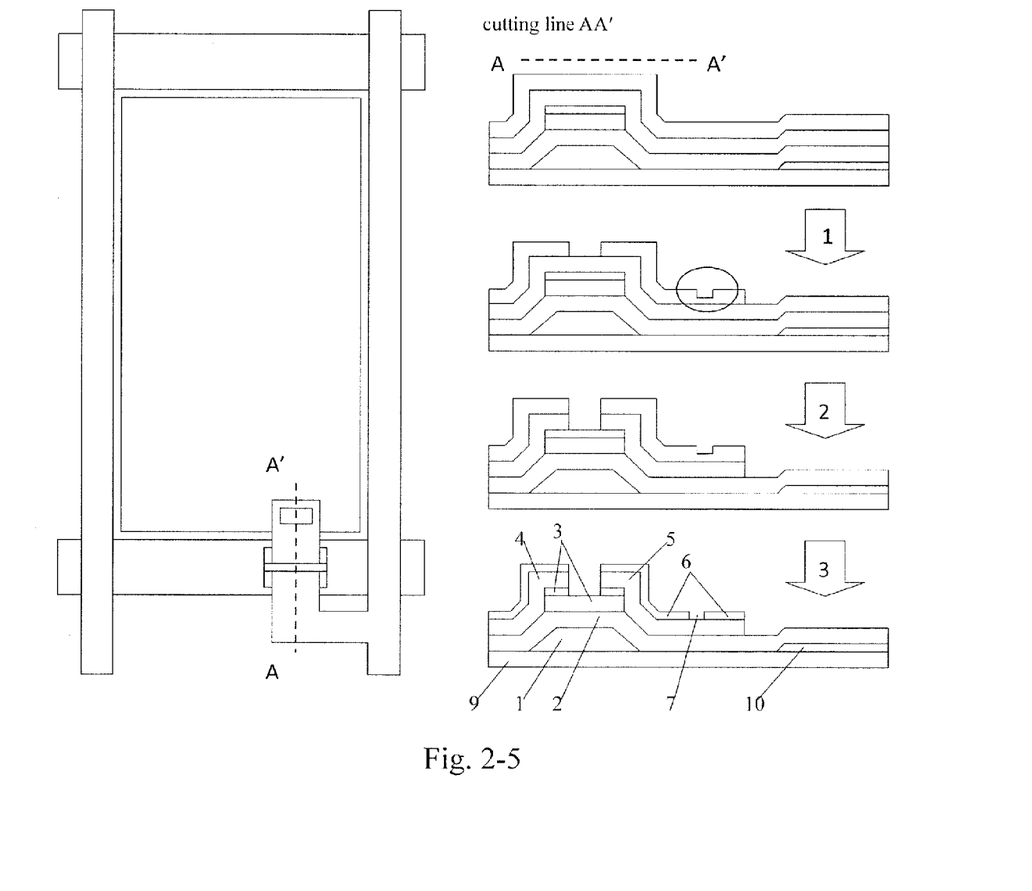

The manufacturing process of the S/D layer in this embodiment is different from the existing process. In order to eliminate the redundant active layer and achieve its primary function without introducing new manufacturing step, in the embodiment of the present invention, the S/D metal and the insulating layer on the S/D are formed by a half-tone mask process, and the S/D layer and the via hole are formed together in one mask process. Therefore, the shortages in the existing technology are eliminated and no new manufacturing step is introduced. As shown in FIG. 2-5, the etching process specifically comprises:

Applying the layer of source/drain electrode material layer and the layer of insulating material, as shown in the figure over the Arrow 1;

The insulating layer is patterned by a half-tone mask process after lamination, exposure, development and etching on the insulating layer, so as to expose the source/drain electrode material layer in the region beyond the regions for forming the source electrode and the drain electrode (including the region for forming the channel) and forming a recess at the portion for forming the via hole, as shown in the figure below the Arrow 1, wherein the circular section represents the position of the via hole. Preferably, the depth (i.e., level difference) of the etched portion other than the portion for the via hole in this etching process is the same to the original height of the layer of insulating material, the depth is preferably 0.4 µm, (i.e. the layer of insulating material in this portion is etched completely). The layer of insulating material remaining at the recess has a thickness of 0.05 µm, i.e. the ratio between the remaining thickness and the original thickness is 8:1. Of course, other values for the ratio can also be used. In consideration of the part of the insulating material layer remaining in the recess needs to be removed together with the doped amorphous silicon at the channel, the thickness of the part of the insulating layer remaining in the recess is preferably smaller than half of the original thickness of the insulating material layer. In this step, as a portion of the insulating layer is left in the recess, the source/drain electrode material layer below the recess is not exposed.

The S/D layer is patterned by using the insulating layer as a mask, so as to form the source electrode and the drain electrode, as shown in the figure below Arrow 2. Herein, the etching of the S/D layer may employ a wet-etching method. For instance, in an exemplary example, the etching process may employ the following parameters: a mixture of $H_3PO_4$: $CH_3COOH$:$HNO_3$:additive A: additive B: $H_2O$=70:11:2.8: 0.1:1:15.1(wt %) as an etchant; temperature 40° C., wherein the additives A and B may be selected from commonly used additives in the field, depending on the specific etching situation. However, it should be noted that the etching process in the embodiment of the present invention is not limited to the above specific etching process, and any other suitable etching processes can also be used.

As shown in the figure below Arrow 3, when the insulating layer is etched, the $N^+$ a-Si layer exposed at the channel is also etched at the same time, the via hole is formed at the recess of the insulating layer, and the a-Si layer is exposed at the channel. For example, the etching in this step can employ a dry-etching method. For instance, in an exemplary example, the following parameters of etching process may be used: a gas mixture of $SF_6$/$O_2$/He=1700/2300/2000 (sccm) as an etchant; temperature 30° C.; pressure of 170 MT. However, it should be noted that the etching process in the embodiment of the present invention is not limited to the above specific etching process, and any other suitable etching processes can also be used.

Thus, in an embodiment of the present invention, the source/drain electrodes and the via hole in the insulating layer are formed by a half-tone mask process.

Figure 26:
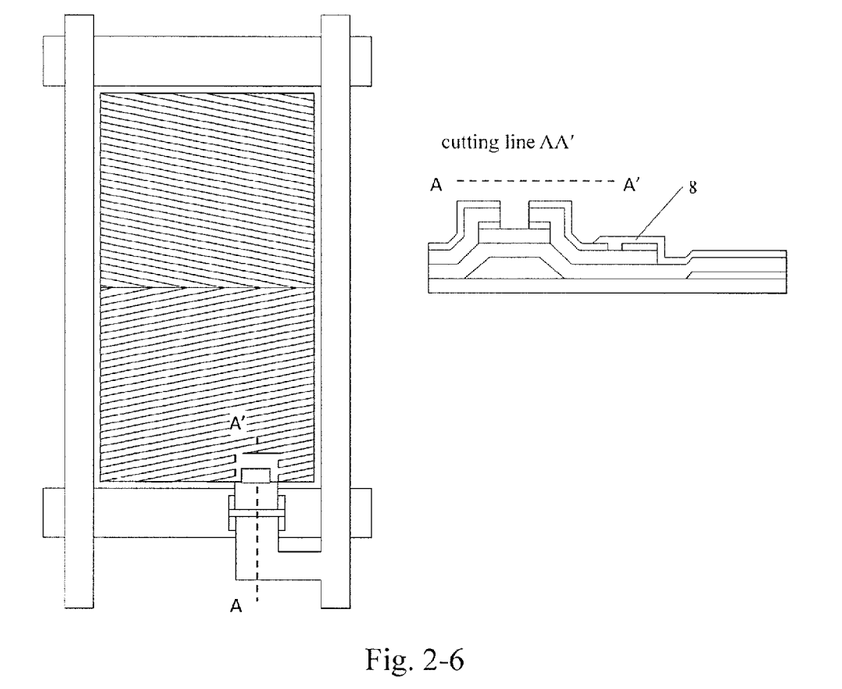

Step S306, forming a second transparent electrode (pixel electrode) by a mask process;

As shown in FIG. 2-6, the pixel electrode 8 is connected to the drain electrode through the via hole, and the specific process for the mask process may employ any suitable existing mask process, which will not be described in detail herein.

Figure 27:
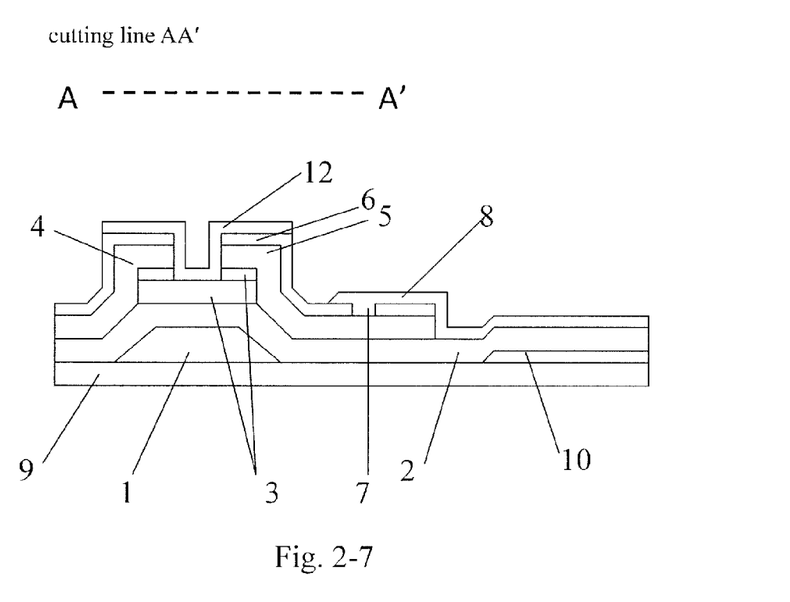

Step S307, forming an insulating protection layer on the channel and a portion of the insulating layer at both sides of the channel by a mask process.

As shown in FIG. 2-7, since the active layer is only disposed on the gate insulating layer opposing to the top of the gate electrode, the insulating protection layer 12 can be merely formed on the channel and the portion of the insulating layer at both sides of the channel.

The protection layer 12 can protect the channel portion of the TFT.

The embodiment of the invention is an improved design on a five-mask process for the existing array substrate, which can be applied in manufacturing FFS array substrate, for example. In the embodiment of the present invention, the patterning of the active layer is achieved in an individual step, and the via hole of the insulating layer is formed in one mask process together with the source/drain electrodes by the half-tone mask process, which can avoid the design issues brought about by the protruding of the edge of the active layer below the source/drain electrodes.

An embodiment of the present invention also provides an array substrate, as shown in FIG. 2-7, it comprises: a substrate 9 (e.g., a glass substrate); a gate electrode 1 and a common electrode 10 disposed on the substrate 9; a gate insulating layer 2 covering the gate electrode 1 and the common electrode 10; an active layer 3 disposed on the gate insulating layer 2 is a position opposing to the top of the gate 1 (i.e., over the gate electrode); a source electrode 4 and a drain electrode 5 disposed on the active layer 3, the source electrode 4 and the drain electrode 5 being separated from each other so as to form a channel in the active layer 3 between the source electrode 4 and the drain electrode 5, the channel being over the gate electrode 1; an insulating layer 6 disposed above the source electrode 4 and the drain 5, the insulating layer 6 having a via hole 7 over the drain electrode 5; and a pixel electrode 8 connected with the drain electrode 5 through the via hole 7, wherein an edge of the active layer 3 is at the inner side of an edge of the source electrode 4 and the drain electrode 5.

In the array substrate in accordance with the embodiment of the present invention, the S/D layer is patterned by using the insulating layer on the S/D layer as a mask for etching, thus the patterned S/D layer and the insulating layer 6 with the via hole therein are formed on the active layer 3 and the gate insulating layer 2. The pixel electrode 8 is arranged in a display region of the array substrate.

In the array substrate in accordance with the embodiment of the present invention, the source/drain electrode material layer is etched by using the insulating layer as a mask, therefore, the edge of the insulating layer is substantially aligned with the edge of the source/drain electrodes.

Preferably, the array substrate in accordance with the embodiment of the present invention further comprises: a protection layer, which is disposed on the channel and a part of the insulating layer 6 at both sides of the channel.

The above mentioned doped amorphous silicon is described with $N^+$ a-Si as an example, but the doped material layer for the active material layer according to the present invention is not limited to the N type doped materials.

Obviously, those skilled in the art may make various modifications and alternations on the invention without departing from spirits and scope of the present invention. Thus, if these modifications and alternations belong to protection scope of the claims and equivalents thereof, then the invention is intended to embrace these modifications and alternations.

What is claimed is:

1. A method for manufacturing an array substrate, comprising:
    forming a patterned active layer on a gate insulating layer, the active layer covering a part of the gate insulating layer;
    forming a source/drain electrode material layer on the active layer and the gate insulating layer;
    forming a patterned insulating layer on the source/drain electrode material layer which is unpatterned, and the patterned insulating layer is formed to have a shape equal to an outline shape of a source electrode, a drain electrode and a channel therebetween to be formed;
    conducting an etching process by using the insulating layer as a mask, so as to etch the source/drain electrode material layer to form the source electrode and the drain electrode, etch a part of the insulating layer to form a via hole in the insulating layer over the drain electrode, and etch a part of the active layer between the source electrode and the drain electrode to form the channel,
    wherein the step of forming the patterned insulating layer comprises:
    applying a layer of insulating material onto the source/drain electrode material layer;
    patterning the layer of insulating material by using a halftone mask process, so as to remove the layer of insulating material beyond a region for forming the source electrode and the drain electrode and expose the source/drain electrode material layer corresponding to a position of the channel, and remove a part of the layer of insulating material corresponding to a position of the via hole to form a recess in the layer of insulating material, wherein a part of the layer of insulating material remains in the recess, so that the source/drain electrode material layer underneath the recess is unexposed,
    wherein the step of conducting the etching process by using the insulating layer as the mask comprises:
    etching the source/drain electrode material layer by using the patterned insulating layer as the mask to remove the source/drain electrode material layer beyond the region for forming the source electrode and the drain electrode, thereby forming the source electrode and the drain electrode and exposing the active layer corresponding to the position of the channel;
    etching the insulating layer to thin the insulating layer and remove the remaining insulating layer in the recess, so as to form the via hole; and
    simultaneously with etching the insulating layer, removing the part of the active layer corresponding to the position of the channel, so as to form the channel.

2. The method according to claim 1,
    wherein the active layer comprises an amorphous silicon layer and a doped amorphous silicon layer on the amorphous silicon layer;
    wherein, simultaneously with etching the insulating layer, the doped amorphous silicon layer is etched to expose the amorphous silicon layer.

3. The method according to claim 1, wherein the source/drain electrode material layer is etched by a wet-etching method, and the insulating layer is etched by a dry-etching method.

4. The method according to claim 1, wherein the thickness of the remaining insulating layer in the recess is smaller than half of an original thickness of the insulating layer.

5. The method according to claim 1, wherein, before forming the active layer, the method further comprises:
    forming a common electrode and a gate electrode on a substrate; and
    forming the gate insulating layer on the common electrode and the gate electrode to cover the common electrode and the gate electrode.

6. The method according to claim 5, wherein the patterned active layer is disposed over the gate electrode.

7. The method according to claim 1, further comprising:
    forming a pixel electrode after forming the via hole, the pixel electrode being connected with the drain electrode through the via hole.

8. The method according to claim 1, further comprising:
    forming an insulating protection layer after forming the pixel electrode, so as to cover the channel and a part of the insulating layer at both sides of the channel.

9. The method according to claim 1, wherein the step of forming the patterned active layer comprises:
    applying a layer of material for forming the active layer onto the gate insulating layer, and
    patterning the layer of material for forming the active layer to form the active layer.

10. The method according to claim 1, wherein an edge of the active layer is at the inner side of an edge of the source electrode and the drain electrode.

11. The method according to claim 1, wherein the ratio between the thickness of the remaining insulating layer in the recess and an original thickness of the insulating layer is 1:8.

* * * * *